US010323487B2

(12) United States Patent
Frosell et al.

(10) Patent No.: US 10,323,487 B2
(45) Date of Patent: Jun. 18, 2019

(54) SYSTEMS AND METHODS TO GENERATE POWER IN A DOWNHOLE ENVIRONMENT

(71) Applicant: Halliburton Energy Services, Inc., Houston, TX (US)

(72) Inventors: Thomas Jules Frosell, Irving, TX (US); Michael Linley Fripp, Carrollton, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/565,885

(22) PCT Filed: Dec. 28, 2016

(86) PCT No.: PCT/US2016/068939
§ 371 (c)(1),
(2) Date: Oct. 11, 2017

(87) PCT Pub. No.: WO2018/125093
PCT Pub. Date: Jul. 5, 2018

(65) Prior Publication Data
US 2018/0313192 A1    Nov. 1, 2018

(51) Int. Cl.
*E21B 41/00* (2006.01)
*H01L 35/30* (2006.01)
(Continued)

(52) U.S. Cl.
CPC .......... *E21B 41/0085* (2013.01); *H01L 35/30* (2013.01); *H02N 11/00* (2013.01); *H01L 35/18* (2013.01); *H01L 35/22* (2013.01)

(58) Field of Classification Search
CPC .............................. E21B 41/0085; H01L 35/30
See application file for complete search history.

(56) References Cited

U.S. PATENT DOCUMENTS

| 6,150,601 A | 11/2000 | Schnatzmeyer et al. |
| 2006/0213669 A1 | 9/2006 | Shipley et al. |

(Continued)

FOREIGN PATENT DOCUMENTS

| WO | 2015013090 A2 | 1/2015 |
| WO | 2016118185 A1 | 7/2016 |

OTHER PUBLICATIONS

International Search Report and Written Opinion dated Sep. 15, 2017, International PCT Application No. PCT/US2016/068939.

*Primary Examiner* — Giovanna C Wright
(74) *Attorney, Agent, or Firm* — McGuireWoods LLP

(57) ABSTRACT

The disclosed embodiments include systems and methods to generate electrical power in a downhole environment. In one embodiment, the system includes a thermoelectric generator operable to convert a temperature gradient across a section of the thermoelectric generator into electrical energy and deployed in a wellbore. The system also includes a pressure control device positioned proximate the thermoelectric generator and having a fluid flow path for a fluid flowing through the pressure control device and across the thermoelectric generator such that an absolute pressure of the fluid decreases when the fluid flow out of the pressure control device and across the thermoelectric generator. A temperature of the fluid changes as the fluid flows out of the thermoelectric generator and across the thermoelectric generator due to a change in the absolute pressure of the fluid. The temperature gradient across the thermoelectric generator is due to change in the temperature of the fluid.

20 Claims, 4 Drawing Sheets

(51) Int. Cl.
*H02N 11/00* (2006.01)
*H01L 35/18* (2006.01)
*H01L 35/22* (2006.01)

(56) References Cited

U.S. PATENT DOCUMENTS

| | | |
|---|---|---|
| 2007/0151591 A1 | 7/2007 | Jeffryes |
| 2008/0128012 A1* | 6/2008 | Schick .................... H01L 35/30 136/201 |
| 2015/0027507 A1 | 1/2015 | Noui-Mehidi |

* cited by examiner

SYSTEMS AND METHODS TO GENERATE POWER IN A DOWNHOLE ENVIRONMENT

BACKGROUND

The present disclosure relates generally to systems and methods to generate electrical power in a downhole environment.

Electronic instruments such as sensors and tools are often deployed in wellbores that extend thousands of feet below the surface, and are utilized during drilling, completion, and production phases of hydrocarbon production. Moreover, electrical conduits are sometimes deployed from the surface downhole to provide electrical power to the downhole electronic instruments. Electrical power is sometimes supplied via one or more conduits that run from a surface location to a downhole location proximate one or more of the electronic instruments. However, running conduits through wellbores that may be several thousand feet deep and may extend horizontally or directionally for several miles is not a cost effective way to provide power to the electronic instruments. Power supplies, such as batteries are sometimes deployed at locations proximate to the electrical instruments to provide power to the electrical instruments. However, power supplies store finite amounts of power, and need to be periodically recharged.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

Figure 1A:
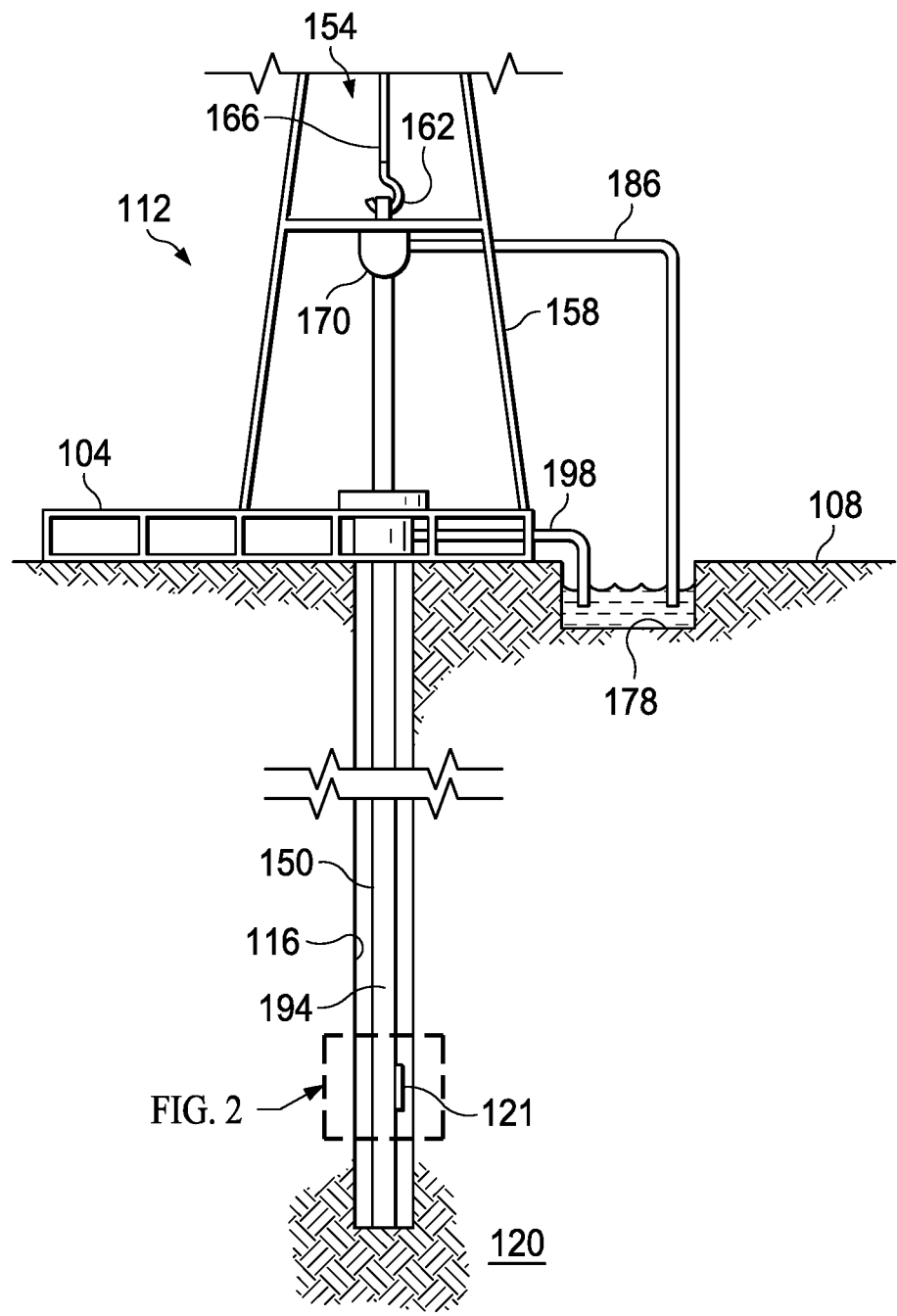
FIG. 1A illustrates a schematic view of an on-shore well having a downhole power generating system deployed in the well.

The illustrated figures are only exemplary and are not intended to assert or imply any limitation with regard to the environment, architecture, design, or process in which different embodiments may be implemented.

DETAILED DESCRIPTION OF ILLUSTRATIVE EMBODIMENTS

In the following detailed description of the illustrative embodiments, reference is made to the accompanying drawings that form a part hereof. These embodiments are described in sufficient detail to enable those skilled in the art to practice the invention, and it is understood that other embodiments may be utilized and that logical structural, mechanical, electrical, and chemical changes may be made without departing from the spirit or scope of the invention. To avoid detail not necessary to enable those skilled in the art to practice the embodiments described herein, the description may omit certain information known to those skilled in the art. The following detailed description is, therefore, not to be taken in a limiting sense, and the scope of the illustrative embodiments is defined only by the appended claims.

The present disclosure relates to systems and methods to generate electrical power in a downhole environment. In one embodiment, a downhole power generating system is deployed in a wellbore proximate an area where fluids of hydrocarbon resources flow from the formation into the wellbore. The downhole power generating system may be deployed along a work string that is lowered into the wellbore. As defined herein, the work sting may include sections of tubing, each of which are joined to adjacent tubing by threaded or other connection types. The work string may refer to the collection of pipes or tubes as a single component, or alternatively to the individual pipes or tubes that comprise the string. The term work string (or tubing string or production string) is not meant to be limiting in nature and may refer to any component or components that are operable to lower or raise the downhole power generating system in the wellbore.

The downhole power generating system includes a thermoelectric generator that is operable to convert a temperature gradient across a section of the thermoelectric generator into electrical energy. In some embodiments, the thermoelectric generator is a solid state device that utilizes n-type (negatively charged) and p-type (positively charged) semiconductors. The thermoelectric generator may be constructed from materials having high electrical conductivity and low thermal conductivity, such as, but not limited to silicon-germanium (SiGe), bismuth-telluride ($Bi_2Te_3$), polysilicon, one or more types of bismuth alloys with antimony, tellurium, and selenium such as $CsBi_4Te_6$. For example, the thermoelectric generator may be constructed from a tellurium alloy such as lead-telluride (PbTe) or $Sb_2Te_3$, an antimony alloy such as zinc-antimony ($\beta$-$Zn_4Sb_3$), AgPb-$SbTe_2$, $CoSb_3$, $CeFe_4Sb_{12}$, $Yb_{0.19}Co_4Sb_{12}$, a manganese alloy such as calcium manganese oxide ($Ca_2Mn_3O_8$), or an ytterbium alloy such as ytterbium-aluminum ($YbAl_3$) or $Yb_{14}MnSb_{11}$. In one embodiment, the thermoelectric generator contains a rare-earth element. One of ordinary skill would understand that various combinations, alloys, and dopings of the foregoing materials may be utilized to form the thermoelectric generator described herein.

The downhole power generating system includes a pressure control device having a fluid flow path for a fluid to flow through the pressure control device, and across the thermoelectric generator. As defined herein, fluid includes any liquid or gaseous substance that flows under an applied sheer stress. Examples of the fluid includes but are not limited to hydrocarbon resources as well as other types of fluids in the formation. Further, in certain well environments, such as in an injection well, the fluid may be fluid for stimulating the formation including but not limited to water-based fluids, carbon dioxide, nitrogen, hydrocarbons, gelled fluids, acid, and hydraulic fracturing fluids. In some embodiments, the pressure control device is an inflow control device (ICD), autonomous inflow control device (AICD), inflow control value (ICV), another device similar component that is operable to generate a pressure drop in the pressure of the fluid as the fluid flows through the pressure control device. In one of such embodiments, the pressure control device is an inflow control device that is operable to produce a pressure drop in the absolute pressure of the fluid as the fluid flows through the inflow control device and across the thermoelectric generator such that the absolute pressure of the fluid as the fluid flows across the thermoelectric generator is less than the absolute pressure of fluid while the fluid is deposited in the formation. In further embodiments, the pressure control device is a nozzle of an inflow control device. In one of such embodiments, the nozzle guides the fluid to flow along an annulus of the nozzle, and across the thermoelectric generator. In another one of such embodiments, the pressure control device is another component of one of the devices disclosed herein. In some embodiments, the pressure control device is utilized to balance fluid flow between the tubing and the formation. In further embodiments, the pressure control device is also utilized to account for the pressure drop of the fluid flowing along the tubing, heterogeneity in the formation, and differences in the fluid composition in the formation.

The pressure and temperature of the fluid as the fluid flows through the downhole power generating system are governed by a Joule-Thomson expansion relationship expressed as $$\mu_{JT} = \left(\frac{\delta T}{\delta P}\right) H,$$

where $\mu_{JT}$ is a Joule-Thomson coefficient of the fluid, $\delta T$ is a change in the temperature of the fluid across the section of the thermoelectric generator, $\delta P$ is a change in the absolute pressure of the fluid when the fluid flows out of the pressure control device, and subscript H reflects that the process is at a constant enthalpy, H. More particularly, a decrease in the pressure of a fluid that has a negative Joule-Thomson coefficient causes the temperature of the fluid to increase. For example, the Joule-Thomson coefficient of oil at 21,000 psi is approximately −0.0055° F./psi. The increase in the temperature of the fluid as the fluid flows across the thermoelectric generator induces a temperature gradient across the thermoelectric generator, which is converted into electrical energy. Equivalently, a decrease in the pressure of a fluid that has a positive Joule-Thomson coefficient will result in the temperature of the fluid decreasing. For example, the Joule-Thomson coefficient of methane at 5,000 psi and 400° F. is approximately +0.0042° F./psi. The decrease in the temperature of the methane as the fluid flow across the thermoelectric generator induces a temperature gradient across the thermoelectric generator, which is converted into electrical energy. Thus, the change in temperature as the fluid passes through the pressure control device can be used as an indication as to whether the fluid is oil or gas. For example, if the fluid is oil at 21,000 psi then the temperature would increase. Moreover, if the fluid is gas at 5,000 psi and 400° F., then the temperature would decrease.

In some embodiments, the downhole power generating system also includes electronic components that are coupled to the thermoelectric generator and are operable to receive energy from the thermoelectric generator. In some examples, the electronic components are sensors that are deployed proximate to the thermoelectric generator. In one of such embodiments, one of the sensors is a sensor that is operable to measure the absolute pressure of the fluid, flow rate of the fluid, temperature of the fluid, material content of the fluid, conductivity of the fluid, and/or other measurable characteristics of the fluid (collectively referred to as "fluid properties"). In another one of such embodiments, another one of the sensors is operable to measure one or more of the conductivity of the formation, temperature of the formation, radioactivity of the formation, material properties of the formation, pH of the formation, temperature of the formation, and/or other quantifiable characteristics of the formation (collectively referred to as the "formation properties").

In some embodiments, the downhole power generating system also includes an energy storage component, such as a battery or a capacitor that is electrically coupled to the thermoelectric generator. The energy storage component is operable to store electrical energy generated by the thermoelectric generator and provide the stored electrical energy to power one or more components of the downhole power generating system or to power other electronic components that are electrically coupled to the downhole power generating system. Additional details of the foregoing downhole power generating system, methods to generate electrical power in a downhole environment, and methods to provide power to downhole electronic components are provided in the paragraphs below and are illustrated in at least FIGS. 1-4.

Figure 1B:
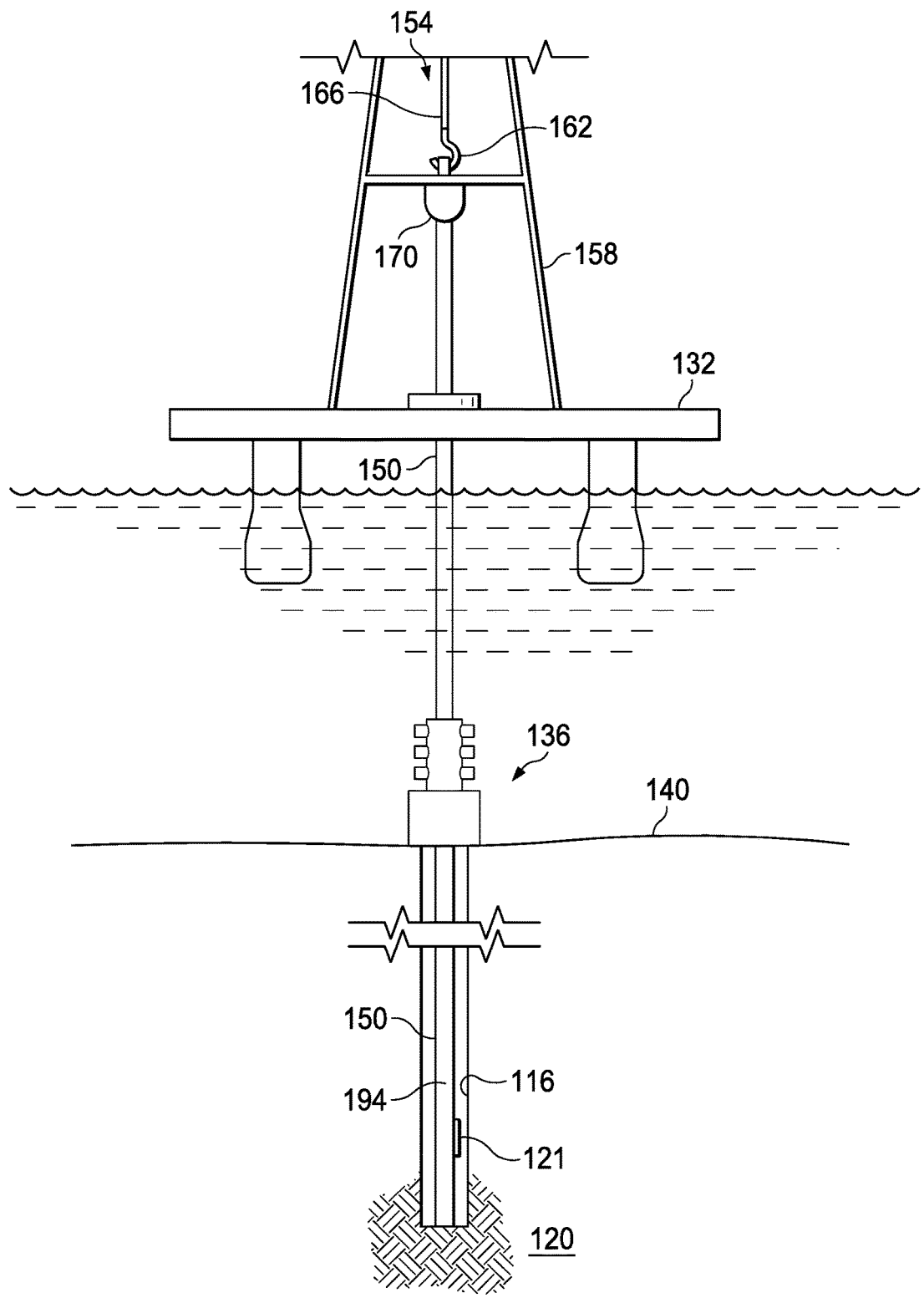
FIG. 1B illustrates a schematic view of an off-shore platform having a downhole power generating system deployed in the well.

Now turning to the figures, FIG. 1A illustrates a schematic view of an on-shore well 112 having a downhole power generating system 121 deployed in the well 112. The well 112 includes a wellbore 116 that extends from surface 108 of the well 112 to a subterranean substrate or formation 120. The well 112 and rig 104 are illustrated onshore in FIG. 1A. Alternatively, FIG. 1B illustrates a schematic view of an off-shore platform 132 having a downhole power generating system 121 according to an illustrative embodiment. The downhole power generating system 121 in FIG. 1B may be deployed in a sub-sea well 136 accessed by the offshore platform 132. The offshore platform 132 may be a floating platform or may instead be anchored to a seabed 140.

In the embodiments illustrated in FIG. 1A, the wellbore 116 has been formed by a drilling process in which dirt, rock and other subterranean material is removed to create the wellbore 116. During or after the drilling process, a portion of the wellbore may be cased with a casing (not illustrated). In other embodiments, the wellbore may be maintained in an open-hole configuration without casing. The embodiments described herein are applicable to either cased or open-hole configurations of the wellbore 116, or a combination of cased and open-hole configurations in a particular wellbore.

After drilling of the wellbore is complete and the associated drill bit and drill string are "tripped" from the wellbore 116, a work string 150 which may eventually function as a production string is lowered into the wellbore 116. In some embodiments, the work string 150 includes an annulus 194 disposed longitudinally in the work string 150 that provides fluid communication between the surface 108 of the well 112 and a downhole location.

The lowering of the work string 150 may be accomplished by a lift assembly 154 associated with a derrick 158 positioned on or adjacent to the rig 104 or offshore platform 132. The lift assembly 154 may include a hook 162, a cable 166, a traveling block (not shown), and a hoist (not shown) that cooperatively work together to lift or lower a swivel 170 that is coupled an upper end of the work string 150. The work string 150 may be raised or lowered as needed to add additional sections of tubing to the work string 150 to position the downhole power generating system 121 at the downhole location in the wellbore 116.

One or more perforations (not shown) may be formed proximate to the downhole power generating system 121 to facilitate flow of hydrocarbon resources and/or other fluids that are deposited in the formation 120 ("fluid") from the formation 120 into the wellbore 116. As stated herein, the downhole power generating system 121 includes a pressure control device described herein and having a fluid flow pathway that guides the fluid from the formation 120, through the pressure control device, and across a section of a thermoelectric generator component of the downhole power generating system 121. As described herein, the pressure control device may be any device or component thereof that is operable to produce a pressure drop in the absolute pressure of the fluid as the fluid flows through the pressure control device and across the thermoelectric generator such that the absolute pressure of the fluid as the fluid flows across the thermoelectric generator is less than the absolute pressure of fluid while the fluid is deposited in the formation 120. Moreover, the relationship between a change in the pressure of the fluid to the change in the temperature of the fluid may be expressed by the Joule-Thomson expansion relationship described herein. The Joule-Thomson coefficient of hydrocarbon resources deposited in a downhole reservoir may be negative or positive depending on temperature, pressure, and the nature of the fluid. Moreover, the decrease in pressure induces an increase in temperature of the fluid if the fluid has a negative Joule-Thomson coefficient, or induces a decrease in the temperature of the fluid if the fluid has a positive Joule-Thomson coefficient. As a result, the temperature change that results from the Joule-Thomson effect may be utilized as an indication of the type of fluid flowing by the thermoelectric generator. In the embodiments of FIGS. 1A and 1B, the absolute pressure of the fluid decreases as the fluid flows out of the formation 120, through the pressure control device, and across the thermoelectric generator. As a result, the temperature of hydrocarbon resources changes as the hydrocarbon resources flow across the thermoelectric generator, thus creating a temperature gradient across the thermoelectric generator. The thermoelectric generator converts the temperature gradient into electrical power, which is then provided by the thermoelectric generator to one or more electronic components that are electrically coupled to the downhole power generating system 121 or to an energy storage component such as a battery or a capacitor.

In the embodiments of FIGS. 1A and 1B, the hydrocarbon resources flow across the thermoelectric generator, through an opening of the work string 150, and into the annulus 194 of the work string 150, where the hydrocarbon resources flow through an outlet conduit 198 into a container 178. In some embodiments, a pump (not shown) pumps the hydrocarbon resources to the surface 108.

Although FIGS. 1A and 1B illustrate completion environments, the downhole power generating system 121 may also be deployed in various production environments or drilling environments where fluid may be guided through the downhole power generating system 121, and where a decrease the in pressure of the fluid may induce a change in the temperature of the fluid as the fluid flows across the thermoelectric generator component of the downhole power generating system 121. Further, although FIGS. 1A and 1B illustrate a single power generating system 121, multiple power generating systems may be deployed in the well 112. In some embodiments, multiple packers or other devices are deployed in the well 112 to isolate one or more sections of the well 112 and/or to divide the well 112 into multiple zones. In one of such embodiments, one or more power generating systems 121 described herein may be deployed in each section and/or zone to harvest electrical energy from fluid flowing through the respective power generating system. In another one of such embodiments, the wellbore 116 is a multilateral wellbore. In such embodiment, one or more power generating systems 121 described herein may be deployed in each lateral wellbore of the multilateral wellbore to harvest electrical energy from fluid flowing through the respective power generating system. Further, although FIGS. 1A and 1B illustrate open-hole configurations, the downhole power generating system 121 described herein may also be deployed in cased-hole configurations. Further, in some embodiments, the downhole power generating system 121 is coupled to or includes one or more screens and/or filters to prevent contaminants, solid particles, or other undesirable particles from flowing through the downhole power generating system. Additional details of the downhole power generating system 121 are provided in the paragraphs below and are illustrated in at least FIGS. 2-4.

Figure 2:
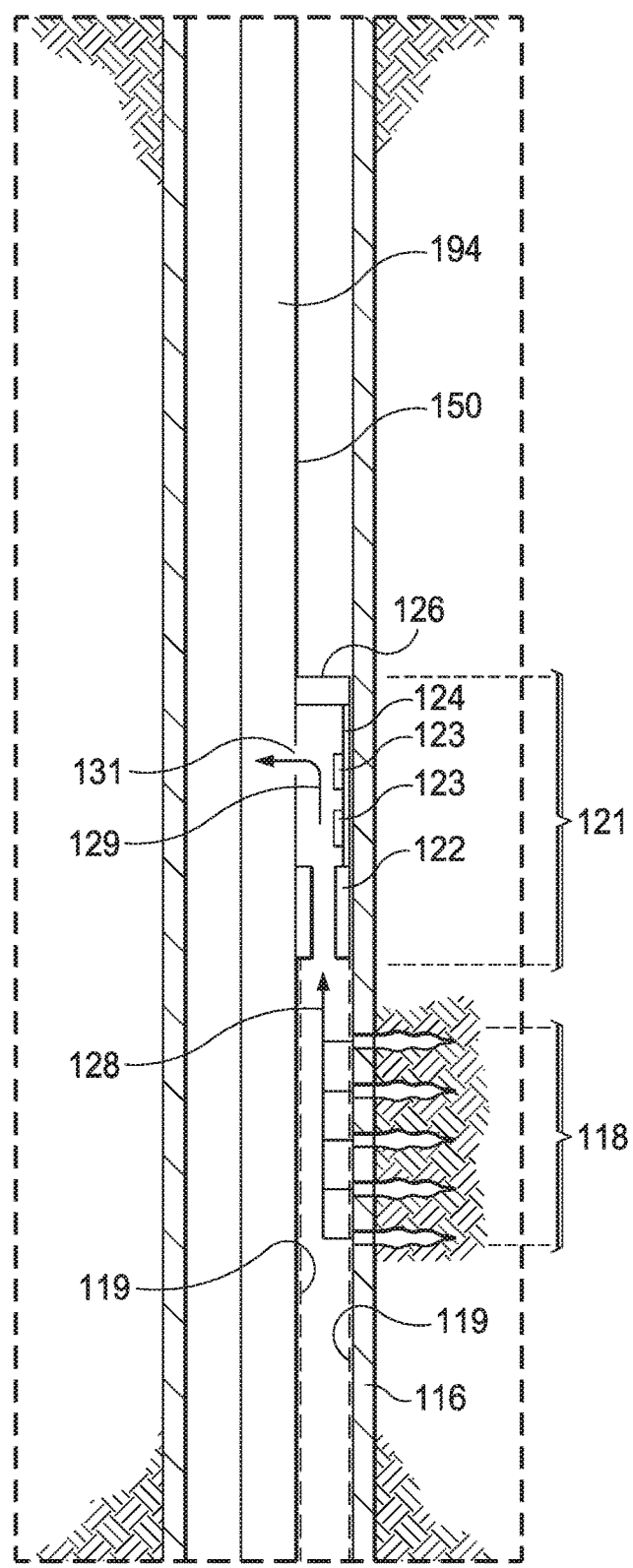
FIG. 2 illustrates a detailed view of the downhole power generating system of FIGS. 1A and 1B.

FIG. 2 illustrates a detailed view of the downhole power generating system 121 of FIGS. 1A and 1B. In the embodiment of FIG. 2, fluid deposited in the formation 120 flows out of the formation 120 through perforations 118. Examples of such fluid include liquid hydrocarbon resources, gaseous hydrocarbon resources, water, carbon dioxide, brine, as well as other types of fluids produced during operation of the well 112 (collectively referred to as "produced fluid"). A pressure control device 122 having a fluid flow path is deployed proximate thermoelectric generator 124. The produced fluid flows in directions indicated by arrows 128 and 129 into a first end of pressure control device 122, through the pressure control device 122, out of a second end of the pressure control device 122, across thermoelectric generator 124, and into the annulus 194 through opening 131. Screens 119 are deployed proximate the pressure control device 122 to prevent contaminates, solid particles, as well as other undesired particles from flowing through the pressure control device 122.

As stated herein, in some embodiments, the pressure control device 122 is an inflow control device or another type of pressure control device, or a component thereof that is operable to generate a pressure drop of the absolute pressure of the produced fluid, such that the absolute pressure of the produced fluid when the produced fluid is deposited in the formation 120 is greater than the absolute pressure of the produced fluid when the produced fluid flows across the thermoelectric generator 124. The change in the absolute pressure of the produced fluid induces a change in temperature in the produced fluid as the produced fluid flows across the thermoelectric generator 124. The thermoelectric generator 124 is operable to convert a temperature gradient across the thermoelectric generator 124, which is induced by the change in the temperature of the produced fluid, into electrical power. In some embodiments, as the produced fluid flows through the pressure control device 122 and across the thermoelectric generator 124, a frictional force exerted by the pressure control device 122 and the thermoelectric generator 124 also increases the temperature of the produced fluid. The increase in temperature due to the frictional force also creates a temperature gradient across the thermoelectric generator 124 as the produced fluid flows across the thermoelectric generator 124. In some embodiments, the thermoelectric generator 124 includes one or more extended surfaces or surface features (collective referred to as "fins") that extend from the thermoelectric generator 124 outward to facilitate heat transfer between the produced fluid to the thermoelectric generator 124. In the embodiment of FIG. 2, fins 123 extend from surfaces of thermoelectric generator 124. In further embodiments, the fluid flow paths through the pressure control device 122 and the thermoelectric generator 124 are also configured to aid heat transfer between the produced fluid to the thermoelectric generator 124.

As stated herein, the thermoelectric generator 124 coverts the temperature gradient across the thermoelectric generator 124 into electrical power. In the embodiment of FIG. 2, the thermoelectric generator 124 is electrically coupled to a sensor 126 that is operable to measure one or more fluid properties of the produced fluid discussed herein. In other embodiments, the thermoelectric generator 124 is operable to provide electrical power to other electronic components that are electrically coupled to the thermoelectric generator 124. In some embodiments, the thermoelectric generator 124 is also coupled to an energy storage component (not shown), that is operable to store an amount of the electrical energy generated by the thermoelectric generator 124. The energy storage component is also electrically coupled to the sensor 126 and/or one or more other electronic components. In some embodiments, the energy storage component is utilized as a backup power supply to supply electrical power to the sensor 126 and/or to the other electronic components when produced fluid is not flowing across the thermoelectric generator 124 or when the flow of the produced fluid does not generate sufficient electrical power for the thermoelectric generator 124 to power the sensor 126 and/or the other electronic components. In some embodiments, the energy storage component is utilized to power the thermoelectric generator 124, the inflow control device, or another electronic component of the downhole power generating system 121.

The produced fluid flowing in the annulus 194 continue to flow towards the surface 108 and is eventually collected in the container 178. In some embodiments, the downhole power generating system 121 is coupled to an interior surface of a screen, a shroud, or a housing that forms a barrier between the downhole power generating system 121 and the wellbore 116. In one of such embodiments, the screen, the shroud, and/or the housing also provides a fluid flow path for the produced fluid to flow from the perforations 118 to the pressure control device. Although the downhole power generating system 121 of FIG. 2 illustrates one pressure control device 122, one thermoelectric generator 124, and one sensor 126, the downhole power generating system 121 may include additional pressure control devices 122, thermoelectric generators 124, sensors 126, and/or electronic components. In some embodiments, where the well 112 is divided into a plurality of zones, each zone is separated from other zones by packers or other wellbore isolation tools. In one of such embodiments, one or more power generating systems 121 may be deployed in each zone of the plurality of zones. In further embodiments, the wellbore 116 is a multilateral wellbore having a plurality of lateral wellbores. In one of such embodiments, a plurality of pressure control devices 122 and thermoelectric generators 124 are deployed at the intersection of the lateral wellbores with the main wellbore. In some embodiments, the downhole power generating system 121 includes multiple pressure control devices. For example, a second pressure control device may be deployed proximate the thermoelectric generator 124 and approximately opposite the pressure control device 122. This second pressure control device may have an identical configuration as the pressure control device 122 or it may be a different configuration. For example, the pressure control device 122 may be a nozzle ICD while the second pressure control device is an ICV that is powered by the electrical energy generated by the thermoelectric generators 124. In another example, the second pressure control device is another nozzle ICD such that a temperature gradient is produced during injection as well as during production.

Although the downhole power generating system 121 of FIG. 2 is deployed proximate perforations 118 and provide a fluid flow path for the produced fluid to flow from the formation 120 through the thermoelectric generator 124, and into the annulus 194, the power downhole generating system 121 is also operable to provide a fluid flow path for other types of fluids that flow through the thermoelectric generator 124 component of the downhole power generating system 121. In some embodiments, the downhole power generating system 121 is deployed in an injection well, and the downhole power generating system 121 is operable to provide a fluid flow path for one or more types of stimulation fluids described herein that flow through the thermoelectric generator 124 component of the downhole power generating system 121. The downhole power generating system 121 may perform operations described herein to generate electrical power based on a change in pressure of the stimulation fluid, provide power to other electrical components, and/or determine one or more properties of the stimulation fluid.

Figure 3:
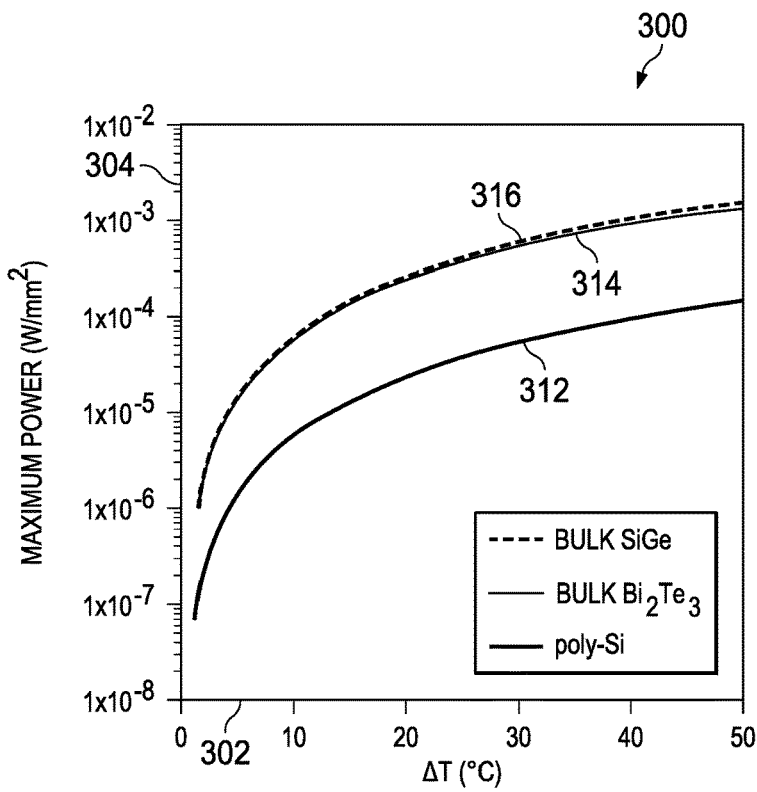
FIG. 3 illustrates a graph of power generated by a thermoelectric generator component of the downhole power generating system of FIG. 2 as a function of temperature change across the thermoelectric generator and materials used to construct the thermoelectric generator.

FIG. 3 illustrates a graph 300 of power generated by the thermoelectric generator 124 of the downhole power generating system 121 of FIG. 2 as a function of temperature change across the thermoelectric generator 124 and materials used to construct the thermoelectric generator 124. Axis 302 represents a temperature gradient across the thermoelectric generator 124 and axis 304 represents electrical power generated by the thermoelectric generator 124. Lines 312, 314, and 316 represent a graph of power generated by the thermoelectric generator 124 as a function of the temperature gradient across the thermoelectric generator 124 if the thermoelectric generator 124 utilizes thermoelectric materials constructed from poly-silicon, bismuth telluride ($Bi_2Te_3$), and silicon-germanium (SiGe), respectively. A maximum of power generated by the thermoelectric generator 124 may be determined by the following equation:

$$P_{max} = \frac{1}{2} FN \frac{A}{L} \Delta T^2 \alpha^2 \sigma \qquad \text{EQ. 1}$$

where F is a fabrication factor representing the packing density of the p-type and n-type semiconductors, N is the number of semiconductor modules used in the construction of the thermoelectric generator, A is the leg area of the semiconductor modules, L is the height of the thermoelectric generator, $\Delta T$ is the change in the temperature across the thermoelectric generator 124, $\alpha$ is a Seebeck coefficient of a material that forms the thermoelectric generator 124, and $\sigma$ is a conductivity of the material that used as the thermoelectric material of the thermoelectric generator 124. Some downhole sensors, such as the sensor 126 and actuator systems utilize 0.1-150 mW to operate. Applying equation EQ1, the thermoelectric generator 124 may generate sufficient electrical energy to power the sensor 126 if the thermoelectric generator 124 has a surface area of approximately 100-200 square inches.

Figure 4:
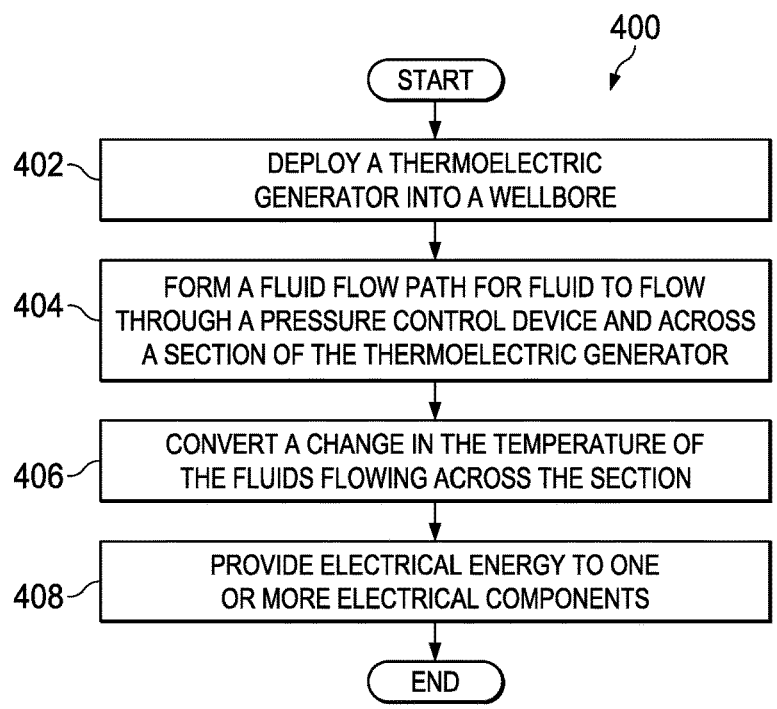
FIG. 4 illustrates a flow chart of a process to provide power to a downhole electronic component.

FIG. 4 illustrates a flow chart of a process 400 to provide power to a downhole electronic component. Although operations in the process 400 are shown in a particular sequence, certain operations may be performed in different sequences or at the same time where feasible. Further, although the operation in the process 400 utilize components of the downhole power generating system 121, the operations may also utilize other downhole power generating systems described herein.

At step 402, the thermoelectric generator component 124 of the downhole power generating system 121 is deployed into the wellbore 116. As stated herein, the thermoelectric generator 124 is operable to convert a temperature change in fluid flowing across the thermoelectric generator 124 into electrical energy. More particularly, the thermoelectric generator 124 is operable to convert a change in temperature of the fluid flowing across the thermoelectric generator 124 into electrical energy, which may be utilized to power one or more electronic components that are electrically coupled to the downhole power generating system 121 or to an energy source component. The pressure control device 122 is also deployed into the wellbore 116 proximate the thermoelectric generator 124.

At step 404, a fluid flow path is formed to flow fluid through the pressure control device 122 and across the thermoelectric generator 124. In some embodiments, the pressure control device 122 is a nozzle of an inflow control device. In some embodiments, the pressure control device is an autonomous inflow control device, a control valve, or another pressure control device described herein that is operable to reduce the pressure of fluid flowing through the pressure control device. The relationship of the pressure of the fluid and the temperature of the fluid may be expressed by the Joule-Thomson expansion relationship, where the pressure change of the fluid is inversely proportional to the temperature change of the fluid if the fluid has a negative Joule-Thomson coefficient. As such, a decrease in pressure of the fluid flowing across the thermoelectric generator 124 induces an increase in the temperature of the fluid as the fluid flows across the thermoelectric generator 124 if the fluid has a negative Joule-Thomson coefficient. In some embodiments, frictional forces exerted by the pressure control device 122 and the thermoelectric generator 124 also increases the temperature of the fluid. In some embodiments, the thermoelectric generator 124 includes one or more extended surfaces or surface features (collective referred to as "fins") that extend from the thermoelectric generator 124 outward to facilitate heat transfer between the flowing fluid to the thermoelectric generator 124. In further embodiments, the fluid flow path through the pressure control device 122 and the thermoelectric generator 124 are also configured to aid heat transfer between the fluid to the thermoelectric generator 124.

At step 406, the thermoelectric generator 124 converts an increase in the temperature of the fluid flowing across the thermoelectric generator 124 into electrical energy. In some embodiments, power generated by the thermoelectric generator 124 is approximately equal to $$P_{max} = \frac{1}{2} FN \frac{A}{L} \Delta T^2 \alpha^2 \sigma.$$

At step 408, the downhole power generating system 121 provides the electrical energy to an electronic component, such as the sensor 126. In some embodiments, the sensor 126 is operable to measure one or more fluid properties of the fluid. In other embodiments, the sensor 126 is operable to measure one or more formation properties of the formation 120. In further embodiments, electrical power generated by the thermoelectric generator 124 is provided to an energy storage device that is electrically coupled to the downhole power generating system 121. The energy storage device may be utilized to store an amount of the electrical power generated by the downhole power generating system 121 and to provide power to the sensor 126, one or more components of the downhole power generating system 121, and/or one or more electronic components when there fluid flow across the thermoelectric generator 124 is insufficient to generate sufficient electrical power to power the sensor 126, the one or more components of the downhole power generating system 121, and/or the one or more electronic components.

The above-disclosed embodiments have been presented for purposes of illustration and to enable one of ordinary skill in the art to practice the disclosure, but the disclosure is not intended to be exhaustive or limited to the forms disclosed. Many insubstantial modifications and variations will be apparent to those of ordinary skill in the art without departing from the scope and spirit of the disclosure. For instance, although the flowcharts depict a serial process, some of the steps/processes may be performed in parallel or out of sequence, or combined into a single step/process. The scope of the claims is intended to broadly cover the disclosed embodiments and any such modification. Further, the following clauses represent additional embodiments of the disclosure and should be considered within the scope of the disclosure:

Clause 1, a downhole power generating system comprising a thermoelectric generator operable to convert a temperature gradient across a section of the thermoelectric generator into electrical energy and deployed in a wellbore; and a pressure control device positioned proximate the thermoelectric generator and having a fluid flow path for a fluid flowing through the pressure control device and across the section of the thermoelectric generator such that an absolute pressure of the fluid decreases when the fluid flows out of the pressure control device and across the section of the thermoelectric generator, wherein a temperature of the fluid changes as the fluid flow out of the pressure control device and across the section of the thermoelectric generator due to a change in the absolute pressure of the fluid, and wherein the temperature gradient across the section of the thermoelectric generator is due to an change in the temperature of the fluid.

Clause 2, the downhole power generating system of clause 1, wherein the temperature gradient across the section is based on a Joule-Thomson expansion relationship expressed as $$\mu_{JT} = \left(\frac{\delta T}{\delta P}\right) H,$$

wherein $\mu_{JT}$ is a Joule-Thomson coefficient of the fluid, $\delta T$ is a change in the temperature of the fluid across the section of the thermoelectric generator, $\delta P$ is a change in the absolute pressure of the fluid when the fluid flows out of the pressure control device, and H is a constant.

Clause 3, the downhole power generating system of clause 1 or 2, wherein the thermoelectric generator comprises n-type and p-type semiconductors.

Clause 4, the downhole power generating system of at least one of clauses 1-3, wherein the semiconductors are formed from at least one of silicon-germanium, SiGe, bismuth telluride $Bi_2Te_3$, and poly-silicon.

Clause 5, the downhole power generating system of at least one of clauses 1-4, wherein the pressure control device is an inflow control device, an autonomous inflow control device, or an inflow control valve.

Clause 6, the downhole power generating system of at least one of clauses 1-5, wherein the pressure control device is a nozzle.

Clause 7, the downhole power generating system of at least one of clauses 1-5, further comprising an electronic component electrically coupled to the thermoelectric generator and operable to receive electrical energy from the thermoelectric generator.

Clause 8, the downhole power generating system of at least one of clauses 1-7, wherein the electronic component is a sensor operable to measure one or more fluid properties of the fluid, the one or more fluid properties comprising at least one of an absolute pressure of the fluid, a flow rate of the fluid, and a temperature of the fluid.

Clause 9, the downhole power generating system of at least one of clauses 1-8, wherein the sensor is operable to measure one or more formation properties of a formation proximate the sensor.

Clause 10, the downhole power generating system of at least one of clauses 1-9, further comprising an energy storage component electrically coupled to the thermoelectric generator and the electronic component and operable to store an amount of electrical energy generated by the thermoelectric generator; and provide electrical energy to the electronic component to power the electronic component.

Clause 11, the downhole power generating system of at least one of clauses 1-10, wherein the electrical energy is utilized to power the thermoelectric generator.

Clause 12, the downhole power generating system of at least one of clauses 1-11, further comprising at least one fin coupled to the thermoelectric generator and operable to facilitate heat transfer between the fluid and the thermoelectric generator.

Clause 13, the downhole power generating system of at least one of clauses 1-12, wherein the temperature change is indicative of a type of the fluid.

Clause 14, the downhole power generating system of at least one of clauses 1-13, wherein the wellbore is a wellbore of an injection well, and wherein the fluid represents at least one type of fluid utilized to stimulating a formation proximate to the downhole power generating system.

Clause 15, the downhole power generating system of at least one of clauses 1-14, wherein the wellbore form a wellbore of a production well, and wherein the fluid is a type of hydrocarbon resource that flows from a formation proximate to the downhole power generating system.

Clause 16, a method to generate electrical power in a downhole environment, comprising deploying a thermoelectric generator into a wellbore, the thermoelectric generator being operable to convert a temperature change in fluid flowing across a section of the thermoelectric generator into electrical energy; deploying a pressure control device having a fluid flow path for the fluid to flow through the pressure control device and across the section of the thermoelectric generator, wherein the temperature of the fluid flowing across the section of the thermoelectric generator changes due to a change in an absolute pressure of the fluid when the fluid flow out of the pressure control device and across the section of the thermoelectric generator; and converting the change in the temperature of the fluids flowing across the section of the thermoelectric generator into electrical energy.

Clause 17, the method of clause 16, further comprising determining a type of the fluid based on the temperature change of the fluid.

Clause 18, a method to provide power to a downhole electronic component, comprising deploying a thermoelectric generator into a wellbore, the thermoelectric generator being operable to convert a temperature change in fluid having a Joule-Thomson coefficient $\mu_{JT}$ flowing across a section of the thermoelectric generator into electrical energy; forming a fluid flow path for the fluid to flow through a pressure control device and across the section of the thermoelectric generator, wherein the temperature of the fluid flowing across the section of the thermoelectric generator changes due to a change in an absolute pressure of the fluid when the fluid flow out of the pressure control device and across the section of the thermoelectric generator; converting a change in the temperature of the fluids flowing across the section of the thermoelectric generator into electrical energy; and providing electrical energy to an electronic component electrically coupled to the thermoelectric generator.

Clause 19, the method of clause 18, further comprising storing a portion of the electrical energy harvested by the thermoelectric generator in an energy storage component electrically coupled to the thermoelectric generator.

Clause 20, the method of clauses 18 or 19, wherein the electronic component is a sensor deployed proximate the thermoelectric generator and operable to measure one or more fluid properties of the fluid, and wherein providing the electrical energy to the electronic component comprises providing the electrical energy to the sensor.

Unless otherwise specified, any use of any form of the terms "connect," "engage," "couple," "attach," or any other term describing an interaction between elements in the foregoing disclosure is not meant to limit the interaction to direct interaction between the elements and may also include indirect interaction between the elements described. As used herein, the singular forms "a", "an" and "the" are intended to include the plural forms as well, unless the context clearly indicates otherwise. Unless otherwise indicated, as used throughout this document, "or" does not require mutual exclusivity. It will be further understood that the terms "comprise" and/or "comprising," when used in this specification and/or the claims, specify the presence of stated features, steps, operations, elements, and/or components, but do not preclude the presence or addition of one or more other features, steps, operations, elements, components, and/or groups thereof. In addition, the steps and components described in the above embodiments and figures are merely illustrative and do not imply that any particular step or component is a requirement of a claimed embodiment.

It should be apparent from the foregoing that embodiments of an invention having significant advantages have been provided. While the embodiments are shown in only a few forms, the embodiments are not limited but are susceptible to various changes and modifications without departing from the spirit thereof.

We claim:
1. A downhole power generating system, comprising:
a thermoelectric generator operable to convert a temperature gradient across a section of the thermoelectric generator into electrical energy and deployed in a wellbore; and
a pressure control device positioned proximate the thermoelectric generator and having a fluid flow path for a fluid flowing through the pressure control device and across the section of the thermoelectric generator such that an absolute pressure of the fluid decreases when the fluid flows out of the pressure control device and across the section of the thermoelectric generator,
wherein a temperature of the fluid changes as the fluid flows out of the pressure control device and across the section of the thermoelectric generator due to a change in the absolute pressure of the fluid, wherein a temperature change across the section of the thermoelectric generator is due to a change in the temperature of the fluid, and wherein after the fluid flows out of the pressure control device and across the section of the thermoelectric generator, the thermoelectric generator converts the temperature change across the section of the thermoelectric generator into electrical energy.

2. The downhole power generating system of claim 1, wherein the temperature gradient across the section is based on a Joule-Thomson expansion relationship expressed as $$\mu_{JT} = \left(\frac{\delta T}{\delta P}\right) H,$$

wherein $\mu_{JT}$ is a Joule-Thomson coefficient of the fluid, $\delta T$ is a change in the temperature of the fluid across the section of the thermoelectric generator, $\delta P$ is a change in the absolute pressure of the fluid when the fluid flows out of the pressure control device, and H is a constant.

3. The downhole power generating system of claim 2, wherein the thermoelectric generator comprises n-type and p-type semiconductors.

4. The downhole power generating system of claim 3, wherein the semiconductors are formed from at least one of silicon-germanium, SiGe, bismuth telluride $Bi_2Te_3$, and poly-silicon.

5. The downhole power generating system of claim 1, wherein the pressure control device is an inflow control device, an autonomous inflow control device, or an inflow control valve.

6. The downhole power generating system of claim 1, wherein the pressure control device is a nozzle.

7. The downhole power generating system of claim 1, further comprising an electronic component electrically coupled to the thermoelectric generator and operable to receive electrical energy from the thermoelectric generator.

8. The downhole power generating system of claim 7, wherein the electronic component is a sensor operable to measure one or more fluid properties of the fluid, the one or more fluid properties comprising at least one of an absolute pressure of the fluid, a flow rate of the fluid, and a temperature of the fluid.

9. The downhole power generating system of claim 8, wherein the sensor is operable to measure one or more formation properties of a formation proximate the sensor.

10. The downhole power generating system of claim 7, further comprising an energy storage component electrically coupled to the thermoelectric generator and the electronic component and operable to:
store an amount of electrical energy generated by the thermoelectric generator; and
provide electrical energy to the electronic component to power the electronic component.

11. The downhole power generating system of claim 1, wherein the electrical energy is utilized to power the thermoelectric generator.

12. The downhole power generating system of claim 1, further comprising at least one fin coupled to the thermoelectric generator and operable to facilitate heat transfer between the fluid and the thermoelectric generator.

13. The downhole power generating system of claim 1, wherein the temperature change is indicative of a type of the fluid.

14. The downhole power generating system of claim 1, wherein the wellbore is a wellbore of an injection well, and wherein the fluid represents at least one type of fluid utilized to stimulating a formation proximate to the downhole power generating system.

15. The downhole power generating system of claim 1, wherein the wellbore form a wellbore of a production well, and wherein the fluid is a type of hydrocarbon resource that flows from a formation proximate to the downhole power generating system.

16. A method to generate electrical power in a downhole environment, comprising:
deploying a thermoelectric generator into a wellbore, the thermoelectric generator being operable to convert a temperature change in a fluid flowing across a section of the thermoelectric generator into electrical energy;
deploying a pressure control device having a fluid flow path for the fluid flowing through the pressure control device and across the section of the thermoelectric generator, wherein the temperature of the fluid flowing across the section of the thermoelectric generator changes due to a change in an absolute pressure of the fluid when the fluid flow out of the pressure control device and across the section of the thermoelectric generator; and
converting a change in the temperature of the fluids flowing across the section of the thermoelectric generator into electrical energy.

17. The method of claim 16, further comprising determining a type of the fluid based on the temperature change of the fluid.

18. A method to provide power to a downhole electronic component, comprising:
deploying a thermoelectric generator into a wellbore, the thermoelectric generator being operable to convert a temperature change in fluid having a Joule-Thomson coefficient $\mu_{JT}$ flowing across a section of the thermoelectric generator into electrical energy;
forming a fluid flow path for the fluid to flow through a pressure control device having a fluid flow path for the fluid flowing through the pressure control device and across the section of the thermoelectric generator, wherein the temperature of the fluid flowing across the section of the thermoelectric generator changes due to a change in an absolute pressure of the fluid when the fluid flow out of the pressure control device and across the section of the thermoelectric generator;
converting an change in the temperature of the fluids flowing across the section of the thermoelectric generator into electrical energy; and
providing electrical energy to an electronic component electrically coupled to the thermoelectric generator.

19. The method of claim 18, further comprising storing a portion of the electrical energy harvested by the thermoelectric generator in an energy storage component electrically coupled to the thermoelectric generator.

20. The method of claim 18, wherein the electronic component is a sensor deployed proximate the thermoelectric generator and operable to measure one or more fluid properties of the fluid, and wherein providing the electrical energy to the electronic component comprises providing the electrical energy to the sensor.

* * * * *